United States Patent [19]
Larsen et al.

[11] Patent Number: 5,338,978
[45] Date of Patent: Aug. 16, 1994

[54] FULL SWING POWER DOWN BUFFER CIRCUIT WITH MULTIPLE POWER SUPPLY ISOLATION

[75] Inventors: David H. Larsen, Scarborough; James B. Boomer, Falmouth, both of Me.

[73] Assignee: National Semiconductor Corporation, Santa Clara, Calif.

[21] Appl. No.: 16,009

[22] Filed: Feb. 10, 1993

[51] Int. Cl.[5] .............................................. H03K 17/10
[52] U.S. Cl. .................................. 307/443; 307/475; 307/296.2
[58] Field of Search ............... 307/443, 451, 473, 475, 307/296.2, 296.5, 296.8

[56] References Cited

U.S. PATENT DOCUMENTS

| | | |
|---|---|---|
| 4,670,668 | 6/1987 | Liu . |
| 4,670,861 | 6/1987 | Shu et al. . |
| 4,837,460 | 6/1989 | Uchida ........................ 307/296.2 X |
| 4,864,373 | 9/1989 | Miyashita . |
| 4,906,056 | 3/1990 | Taniguchi . |
| 4,961,010 | 10/1990 | Davis . |
| 5,036,222 | 7/1991 | Davis . |
| 5,060,044 | 10/1991 | Tomassetti . |
| 5,117,129 | 5/1992 | Hoffman et al. . |
| 5,157,279 | 10/1992 | Lee ................................. 307/296.2 |
| 5,160,855 | 11/1992 | Dobberpuhl ..................... 307/475 X |
| 5,191,244 | 3/1993 | Runaldue et al. ............... 307/443 X |

*Primary Examiner*—David R. Hudspeth
*Attorney, Agent, or Firm*—Daniel H. Kane; Richard C. Calderwood; Stephen R. Robinson

[57] ABSTRACT

A full swing CMOS output buffer circuit (20,30,40,50) isolates incompatible power supply circuits such as 3.3 v standard and 5 v standard subcircuits, and isolates power supply rails of quiet or powered down buffer circuits from the common external bus. The pullup output transistor (PMOS1) is fabricated in a well (NWELL) of N type carrier semiconductor material formed in a substrate (PSUB) of P type carrier semiconductor material. A P channel NWELL isolation switch transistor (PW1) has a primary current path coupled between the well (NWELL) and high potential power rail (VCC) and a control gate node coupled to the control gate node of the pullup output transistor (PMOS1) for operating substantially in phase. The NWELL isolation switch transistor (PW1) isolates the pullup output transistor (PMOS1) well (NWELL) from the high potential power rail (VCC). An N channel control node isolation transistor (N1) has a control node coupled to the high potential power rail (VCC) for isolating the control nodes of the output transistors (PMOS1,-NMOS1) from each other during power down. A P channel feedback turn off transistor (PP1) has a control node coupled to the high potential power rail (VCC) for turning off the output transistor (PMOS1) in response to a higher potential level signal at the output ($V_{OUT}$). A delay discharge circuit (DDC) discharges transient charge from the high potential power rail (VCC) during power down.

27 Claims, 5 Drawing Sheets

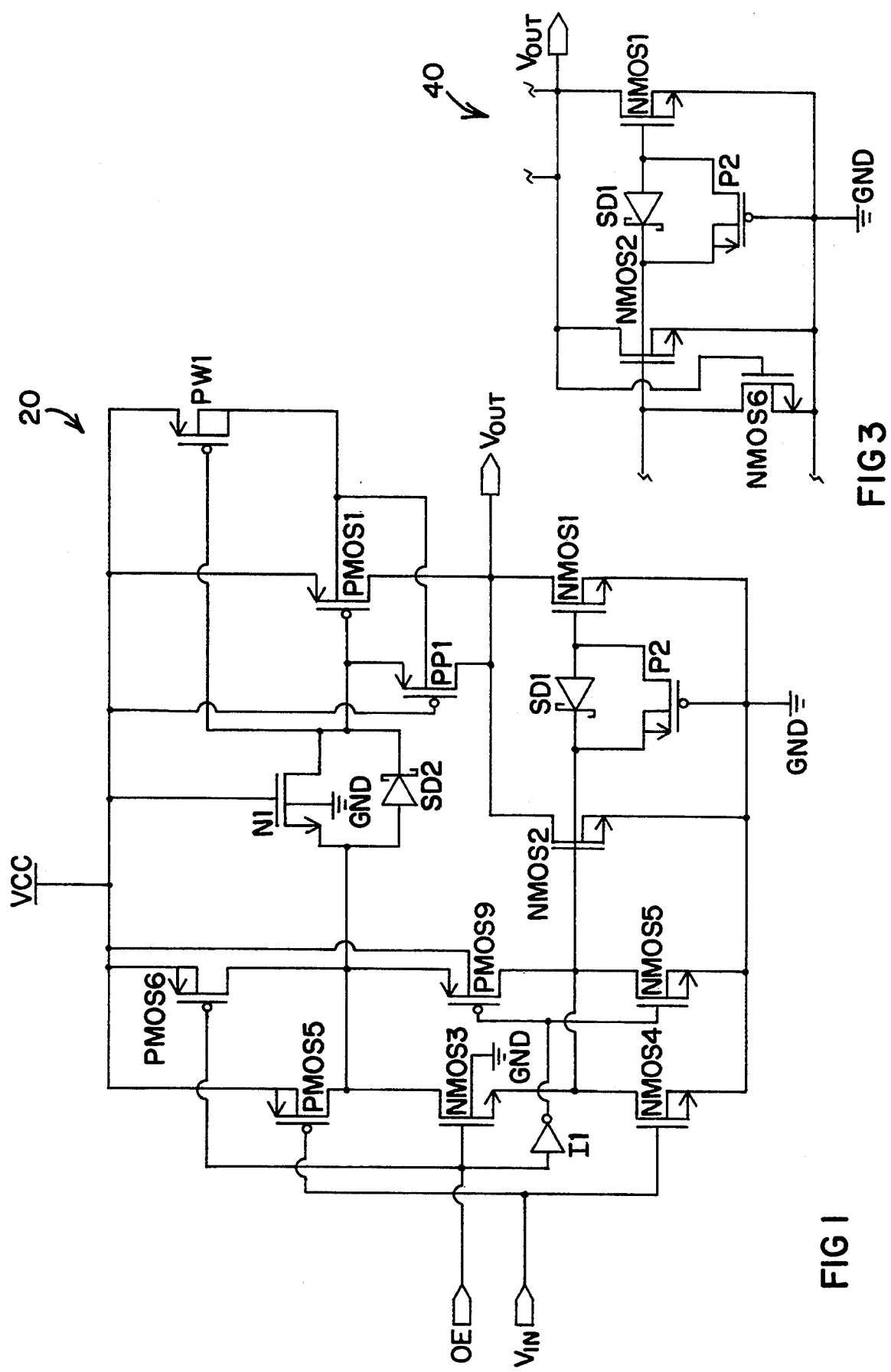

FULL SWING POWER DOWN BUFFER CIRCUIT WITH MULTIPLE POWER SUPPLY ISOLATION

TECHNICAL FIELD

This invention relates to a new buffer circuit applicable for multiple output buffer circuit systems driving a common external bus. The invention provides a full swing CMOS output buffer circuit which can be "hot inserted" or "powered down" in a partial system power down while other buffer circuits are active on the common external bus without disruptive loading or degradation of signals. The invention is also applicable to multiple output buffer circuit systems operating from multiple incompatible power supplies for translating logic signals between respective voltage levels while isolating the different power supplies. For example, the invention is applicable for translating between and isolating standard 5 v power supply subcircuits and the new JEDEC Standard 8-1A 3.3 v power supply subcircuits.

BACKGROUND ART

In conventional output buffer circuits coupled to a common external bus, a problem occurs during "power down" and "power up" of the power supply rails of selected buffer circuits and during "hot insertion" of the output buffer circuits. During partial system power down of selected output buffer circuits, the output bus may remain active, driven by other output buffer circuits. In NWELL CMOS technology, the high potential level signals appearing at the output of a powered down output buffer circuit may forward bias the parasitic PN junction diode between the P type substrate PSUB and the NWELL of the P channel or PMOS pullup output transistor. The NWELL of the PMOS pullup transistor is in turn coupled to the powered down high potential power rail VCC. This leakage current may recharge the high potential power rail and turn on the output buffer circuit or selected internal nodes providing paths to the low potential power rail GND or high potential power rail VCC through the output buffer circuit. The undesirable results include loading the external bus, causing "bus contention", degrading signals, and causing possible false signals on the external output bus. Ideally, the powered down output buffer circuit should remain a high impedance at the output, isolating the external bus from the powered down output buffer circuit power rails.

A disadvantage of existing solutions for avoiding this leakage path to the VCC power rail for powered down output buffer circuits is that they prevent the use of full swing CMOS buffer circuits. According to one solution, bipolar transistors are used for the output pullup transistors in a bipolar or BICMOS output buffer circuit. While the bipolar output pullup transistors isolate internal nodes from the external output bus, they are not capable of pulling the output node to the power rail potential levels. As a result the noise margins of the system are reduced and additionally, the bipolar transistors consume static current. According to another solution an enhancement mode N channel or NMOS transistor is used for the output pullup transistor instead of a PMOS transistor. The enhancement mode NMOS pullup transistor similarly introduces a threshold voltage drop and is unable to pull the output node to the voltage level of the high potential power rail VCC.

A similar problem is encountered in multiple output buffer circuit systems with mismatched or incompatible power supplies. Some of the subsystems and output buffer circuits driving the external output bus are coupled to a first power supply while other subsystems and output buffer circuits are coupled to a second power supply at a different voltage level. A current problem exists in systems combining 5 volt standard power supply circuits with the new JEDEC Standard 8-1A 3.3 volt power supply circuits. A 5 volt signal on the common bus driven by a 5 volt standard output buffer circuit may cause a leakage current path to the lower potential 3.3 volt power rail of the 3.3 v standard output buffer circuit through the PN junction at the drain to NWELL forming a parasitic P+D/NWELL diode through the PMOS output pullup transistor. Similar problems may occur in 3.3 v/5 v and 5 v/3.3 v translators incorporated in the multiple power supply system.

To provide further background, in 1992 the Joint Electron Device Engineering Council (JEDEC) of the Electronic Industries Association (EIA) adopted a new low voltage integrated circuit standard based on a 3.3 v power supply. This new low voltage standard is designated the JEDEC Standard 8-1A and is commonly known as the 3 v standard. The new JEDEC Standard 8-1A at nominal 3.3 v is to be contrasted with the conventional integrated circuit JEDEC Standards 18 and 20 for a 5 v power supply. The 3.3 v and 5 v standards are incompatible with respect to voltage levels of the respective power supplies and the logic high and low potential level signals generated by the two different circuits.

For the conventional 5 v standard and the new 3.3 v standard, the respective CMOS output buffers generally pull the output to the respective rail voltages for logic high and low potential levels under zero load or lightly loaded conditions at the output. Because of the incompatibly of the 3.3 v and 5 v standard supply voltage levels and the respective CMOS logic high and low potential level signals, translation is required for communication between 3.3 v and 5 v standard subcircuits. The new low voltage standard for a power supply at nominal 3.3 v is applicable as well for CMOS, bipolar, and BICMOS technology IC's.

Applications for the new 3.3 v standard include notebook sub-notebook, power book, hand held, and pen based portable and mobile personal computers, generally referred to as personal digital assistants or PDA's. The 3.3 v standard requires less power dissipation from the battery power supplies for longer operating life. Another advantage of the new low voltage standard is that the new CMOS logic signal high and low potential levels are compatible with bipolar TTL circuit logic signal potential levels. A difficulty with application of the new 3.3 v standard in notebook and PDA computers however is that all of the computer subsystems cannot necessarily be converted to the 3.3 v standard. For example available disk drives continue to operate on the basis of the 5 volt standard and the disk drive subsystem including the disk controller must therefore be based on the 5 v standard circuits.

In such a notebook or other PDA computer, the system board or motherboard includes the 3.3 v microprocessor ($\mu$P) computer system and a plurality of ports for controlling peripherals such as a liquid crystal display (LCD) port, communications port RS232, power supply port, and external memory port. The disk drive port however may communicate with a 5 volt subsystem, namely the disk controller which operates the hard disk drive. A translator is therefore required between the 3.3 v μP system and the disk drive port and 5 v disk drive controller subsystem. Such a 3.3 v to 5 v translator is provided for example by the National Semiconductor Corporation translator device LVX4245 (TM).

A problem comparable to the "power down" problem occurs with the new combined multiple power supply systems such as the combined 3.3 v and 5 v power supply subsystems and translators with multiple incompatible power supply output buffer circuits coupled to a common bus. Parasitic leakage paths may develop from the higher voltage level power supply signals applied to the output bus by an active buffer circuit to the lower voltage power supply rail of quiet output buffer circuits on the common bus. Isolation is also required to prevent power supply contention within translator circuits.

OBJECTS OF THE INVENTION

It is therefore an object of the present invention to provide a new output buffer circuit configuration for a full swing CMOS buffer circuit capable of "powering down" while still presenting a high impedance to a common external output bus. The new output buffer circuit prevents a parasitic leakage current path from the output bus through the PMOS pullup transistor to a powered down high potential power rail. In effect, the invention assures a "power down tristate" condition.

Another object of the present invention is to provide a full swing CMOS output buffer circuit which avoids loading the common bus, causing bus contention, degrading signals or causing false signals on the common output bus during "power down" or "hot insertion". Importantly, the output pullup transistor is a P channel transistor for full swing CMOS operation.

A further object of the invention is to provide a new output buffer circuit configuration for use in multiple power supply common bus output buffer circuit systems which prevents destructive leakage paths between different incompatible power supplies. For example the present invention is suitable for use in system circuits combining and mixing 5 v standard circuits and 3.3 v standard circuits including 3.3 v/5 v and 5 v/3.3 v translators and output buffer circuits.

DISCLOSURE OF THE INVENTION

In order to accomplish these results the invention provides a new buffer circuit of the type having an output ($V_{OUT}$) for delivering output signals of high and low potential levels and a P channel pullup output transistor (PMOS1) having a primary current path coupled between the output and a high potential power rail. The pullup output transistor (PMOS1) has a control node coupled in the buffer circuit for controlling the conducting state of the pullup output transistor primary current path for coupling the high potential power rail (VCC) to the output ($V_{OUT}$). The pullup output transistor is fabricated in a well (NWELL) of N type carrier semiconductor material formed in a substrate (PSUB) of P type carrier semiconductor material. The well is coupled to the high potential power rail (VCC) and the substrate is coupled to the low potential power rail (GND).

According to the invention there is provided a P channel NWELL isolation switch transistor (PW1) having a primary current path coupled between the well (NWELL) and high potential power rail (VCC). The NWELL isolation switch transistor (PW1) has a control node coupled in the buffer circuit to the control node of the pullup output transistor (PMOS1) for controlling the conducting state of the NWELL isolation switch transistor (PW1) substantially in phase with the output pullup transistor (PMOS1). The well (NWELL) of the pullup output transistor (PMOS1) is thereby isolated from the high potential power rail (VCC) when the pullup output transistor (PMOS1) is not conducting.

More specifically, the output buffer circuit is of the type with pullup and pulldown output transistors (PMOS1, NMOS1) coupled to the output with control nodes coupled in the buffer circuit. An input ($V_{IN}$) receives data input signals, and a predriver circuit is coupled between the input ($V_{IN}$) and control nodes of the pullup and pulldown output transistors (PMOS1, NMOS1) for driving the output transistors.

According to a further feature of the invention, an N channel control node isolation transistor (N1) is provided having a primary current path coupled between the control node of the pullup output transistor (PMOS1) and the predriver circuit of the buffer circuit. The control node isolation transistor (N1) has a control node coupled to the high potential power rail (VCC) for turning off the control node isolation transistor (N1) and isolating the control nodes of the output transistors (PMOS1, NMOS1) from each other during power down of the high potential power rail (VCC) or during use of incompatible power supply voltage levels.

The invention also provides a P channel feedback turn off transistor (PP1) having a primary current path coupled between the output ($V_{OUT}$) and the control node of the pullup output transistor (PMOS1). The feedback turn off transistor (PP1) has a control node coupled to the high potential power rail (VCC) for turning off the pullup output transistor (PMOS1) in response to a high potential level signal at the output ($V_{OUT}$) during power down of the buffer circuit or during use of different incompatible power supplies.

An advantage of the output buffer circuit of the present invention is that it is applicable not only for partial power down of a multiple output buffer circuit system but is also applicable for solving the problem of mismatched or incompatible power supplies on the same chip. Thus subsystems coupled to a common external bus can be driven by mismatched or incompatible power supplies such as the 3.3 v standard and 5 v standard power supplies. The NWELL isolation switch transistor (PW1) which opens or becomes nonconducting in phase with the output pullup transistor (PMOS1) thwarts or prevents a destructive path from a 5 volt signal at the output bus to the 3.3 v internal power supply rail of a quiet 3.3 v standard output buffer circuit on the common bus. As a result both 3.3 v and 5 v subsystems and output buffer circuits may coexist coupled to the same common bus while the incompatible or mismatched power supply rails remain isolated. The output buffer circuits also permit translation from 3.3 volt to 5 volt level signals with isolation of the respective power rails.

According to other features of the invention a P channel pull-to-the-rail transistor (PP2) is provided for use during normal mode operation. A primary current path is coupled between the control node of the pullup output transistor (PMOS1) and high potential power rail (VCC). The pull-to-the-rail transistor (PP2) has a control node coupled to the output ($V_{OUT}$) for pullup of the control node of the pullup output transistor (PMOS1) to the high potential power rail (VCC) potential level in response to a low potential level signal at the output ($V_{OUT}$).

According to another feature of the invention the pullup output transistor (PMOS1), P channel isolation switch transistor (PW1), feedback turn off transistor (PP1) and P channel pull-to-the-rail transistor (PP2) are fabricated in the same well (NWELL) of N type carrier semiconductor material.

The invention may also include an N channel pull-to-the-rail transistor (NMOS6) having a primary current path coupled between the control node of an N channel pulldown output transistor (NMOS1) and low potential power rail (GND). The control node of the N channel pull-to-the-rail transistor (NMOS6) is coupled to the output ($V_{OUT}$) to pull down the control node of the pulldown output transistor (NMOS1) to the low potential power rail (GND) potential level in response to a high potential level signal at the output ($V_{OUT}$).

The invention also provides a delay discharge circuit (DDC) coupled between the output ($V_{OUT}$) and low potential power rail (GND) and between the high potential power rail (VCC) and low potential power rail (GND). The DDC incorporates an RC delay network coupled between the high potential power rail (VCC) and low potential power rail (GND) with an intermediate node (nrc).

The DDC also incorporates a driver stage (PMOS2, NMOS7) having primary current paths coupled between the output ($V_{OUT}$) and an output node (no) and between the output node (no) and low potential power rail (GND). An input control node of the driver stage is coupled to the intermediate node (nrc) of the RC delay network. The driver stage is constructed to deliver current to the output node (no) in response to a transient high potential level signal at the output bus and output ($V_{OUT}$) during power down of the buffer circuit.

The DDC also includes a VCC discharge transistor (NMOS8) having a primary current path coupled between the high potential power rail (VCC) and low potential power rail (GND). The control node of the VCC discharge transistor (NMOS8) is coupled to the output node (no) of the DDC driver stage (PMOS2, NMOS7) for discharging transient charge from the high potential power rail (VCC) upon occurrence of high potential level signals on the bus and output ($V_{OUT}$) during power down of the buffer circuit.

Other objects, features, and advantages of the invention are apparent in the following specification and accompanying drawings.

BRIEF DESCRIPTION OF THE DRAWINGS

FIG. 1 is a schematic circuit diagram of a new output buffer circuit according to the invention incorporating new components PW1, PP1, N1, and SD2.

FIG. 3 is a fragmentary schematic circuit diagram of an alternative output buffer circuit embodiment for the circuit of FIG. 1 adding the new circuit feature NMOS6 in addition to the new components PW1, PP1, N1, and SD1.

DESCRIPTION OF PREFERRED EXAMPLE EMBODIMENTS AND BEST MODE OF THE INVENTION

Figure 1A:
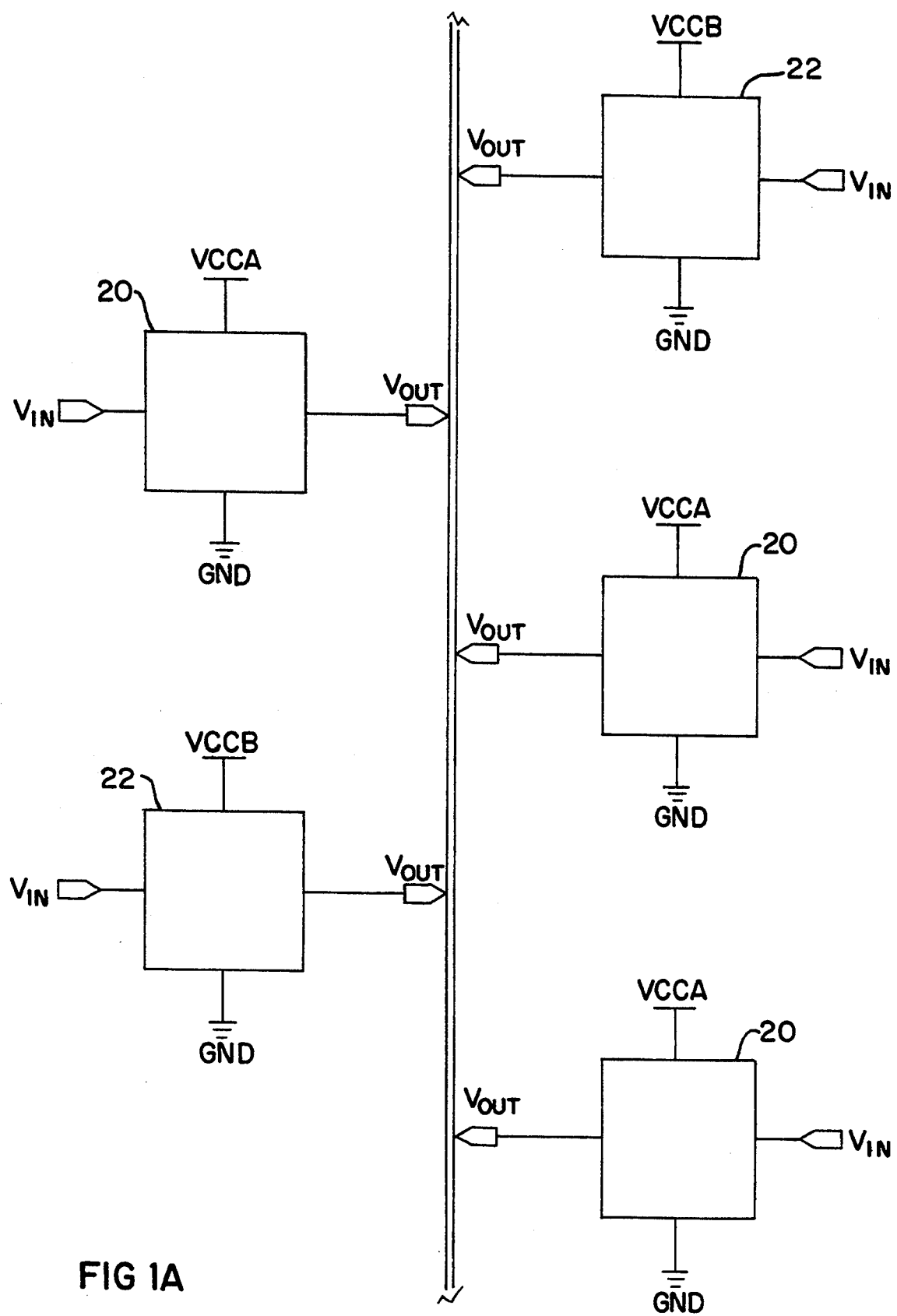
FIG. 1A is a system of multiple output buffers.

A full swing CMOS output buffer circuit 20 according to the present invention is illustrated in FIG. 1. The output buffer circuit 20 may be one of a system of multiple output buffer circuits 20, 22 coupled at respective outputs $V_{OUT}$ to a common external bus 25 as shown in FIG. 1A. The output buffer circuit 20 delivers output signals of logic high and low potential levels at the output $V_{OUT}$ in response to data signals at the input $V_{IN}$. Output buffer circuit 20 also incorporates a tristate enable circuit with a tristate enable input OE for implementing a high impedance third state at the output $V_{OUT}$ at the common bus 25 when the output buffer circuit is inactive or quiet and other buffer circuits are active on the external bus 25.

For delivering logic high and low potential level signals at the output $V_{OUT}$, a P channel pullup output transistor PMOS1 is coupled between the high potential power rail VCC and the output $V_{OUT}$. An N channel primary pulldown output transistor NMOS1 is coupled between the output $V_{OUT}$ and the low potential power rail GND. The output pulldown circuit for buffer circuit 20 also incorporates a small channel width secondary pulldown output transistor NMOS2 coupled in parallel with the primary pulldown output transistor NMOS1 with a delay element provided by PMOS transistor P2. The primary current path of delay transistor P2 is coupled between the control gate nodes of the secondary and primary pulldown output transistors NMOS2, NMOS1.

This output pulldown circuit arrangement provides bifurcated turn on of sinking current from the output $V_{OUT}$ during transition from logic high to low potential level at the output $V_{OUT}$. This is accomplished by initial turn on of the small channel width secondary pulldown output transistor NMOS2 in response to an input signal followed after the selected delay period by turn on of the primary pulldown output transistor NMOS1. Bifurcated turn on of the output sinking current reduces switching induced noise, i.e. ground bounce and ground undershoot as further described in the Jeffrey B. Davis U.S. Pat. No. 4,961,010 issued Oct. 2, 1990 for OUTPUT BUFFER FOR REDUCING SWITCHING INDUCED NOISE and the Jeffrey B. Davis U.S. Pat. No. 5,036,222 issued Jul. 30, 1991 for OUTPUT BUFFER CIRCUIT WITH OUTPUT VOLTAGE SENSING FOR REDUCING SWITCHING INDUCED NOISE. Schottky diode SD1 facilitates turn off of the primary pulldown output transistor NMOS1 during transition from logic low to high potential level at the output $V_{OUT}$.

The input $V_{IN}$ is coupled to a predriver circuit PMOS5, NMOS4, PMOS6, NMOS3, I1, PMOS9, NMOS5 for driving the pullup and pulldown output transistors PMOS1, NMOS1. The tristate enable input OE is also coupled to the predriver circuit which incorporates the tristate enable circuit for implementing the high impedance third state. The predriver circuit is by way of example a merged NAND/NOR gate type predriver which reduces simultaneous conduction of the output pullup and pulldown transistors.

According to the invention a P channel NWELL switch transistor PW1 is coupled with the primary current path between the high potential power rail VCC and the NWELL or backgate of pullup output transistor PMOS1. The control gate node of NWELL switch transistor PW1 is coupled to the control gate node of pullup output transistor PMOS1 so that the transistors PW1 and PMOS1 are operating substantially in phase. As hereafter further described the P channel transistors of interest at the output $V_{OUT}$ are constructed in the same NWELL and this NWELL is driven by NWELL switch transistor PW1. PMOS transistor PW1 is therefore able to isolate the NWELL of P channel transistors at the output from the high potential power rail VCC. The output NWELL is isolated from VCC when NWELL switch transistor PW1 is not conducting. This occurs when the control gate nodes of NWELL switch transistor PW1 and pullup output transistor PMOS1 are driven by a logic high potential level signal during power down of the high potential power rail VCC of output buffer circuit 20; and when different incompatible power supply voltage levels appear at the output $V_{OUT}$ and high potential power rail VCC as subsequently explained.

A P channel feedback transistor PP1 is also incorporated in the output circuit with primary current path between the control gate node of pullup output transistor PMOS1 and the output $V_{OUT}$. The control gate node of feedback transistor PP1 is coupled to the high potential power rail VCC so that it is normally not conducting. However during power down or during occurrence of unbalanced or incompatible power supply voltage levels at the output $V_{OUT}$ and power rail VCC, feedback transistor PP1 will feedback a logic high potential level signal at the output $V_{OUT}$ to the control gate nodes of NWELL switch transistor PW1 and pullup output transistor PMOS1. Transistor PW1 and PMOS1 are therefore held in a nonconducting state. Under these conditions feedback transistor PP1 back drives the control gate nodes of PW1, PMOS1 upon occurrence of logic high potential level signals at the output $V_{OUT}$. The leakage current path through the parasitic junction diode at the NWELL to VCC is blocked by NWELL switch transistor PW1 as well as any direct current path through the pullup output transistor PMOS1. The powered down power rail VCC remains isolated from the output $V_{OUT}$.

Because feedback transistor PP1 is also constructed in the same NWELL as other P channel output transistors, the parasitic diode path from the P type substrate PSUB and NWELL to VCC through feedback transistor PP1 is also blocked by the NWELL switch transistor PW1. As hereafter further described all P channel transistors associated with the pullup output circuit are constructed in a common NWELL driven from the high potential power rail VCC only through NWELL switch transistor PW1. Full isolation of the high potential power rail VCC from the output $V_{OUT}$ is therefore achieved.

Also included in the output buffer circuit 20 of FIG. 1 is an N channel isolation pass through gate transistor N1 having primary current path coupled between the control gate node of pullup output transistor PMOS1 and the input transistors PMOS5, NMOS4 of the buffer circuit 20. The control gate node of N channel isolation transistor N1 is coupled to the high potential power rail VCC. During power down of the buffer circuit 20 and during occurrence of unbalanced or incompatible power supply voltage levels at the output $V_{OUT}$ and power rail VCC, NMOS isolation gate transistor N1 isolates the control gate nodes of the pullup and pulldown output transistors PMOS1, NMOS1. Schottky diode SD2 facilitates turn off of the pullup output transistor PMOS1.

For further understanding of the operation of the output buffer circuit 20 in the context of a system of multiple output buffer circuits tied to a common bus with multiple incompatible power supplies, reference is also made to FIG. 1A. As shown in FIG. 1A some of the output buffer circuits 20 are coupled to a high potential level power supply VCCA of for example 3.3 v such as the JEDEC Standard 8-1A 3.3 v standard power supply. Other output buffer circuits 22 are coupled to a 5 v standard power supply VCCB. When output buffer circuits 20 coupled to 3.3 v power supply rails VCCA are inactive in the tristate mode, 5 volt signals may appear on the common bus 25 driven by one of the output buffer circuits 22 coupled to a 5 v power supply VCCB. A 5 v signal may therefore appear at the output $V_{OUT}$ of a quiet 3.3 v output buffer circuit 20.

Because the control gate node of feedback transistor PP1 is coupled to the relatively lower potential level of VCCA, PP1 is conducting and back drives the gate nodes of NWELL switch transistor PW1 and pullup output transistor PMOS1 so they remain fully off. The 5 volt signal at the output $V_{OUT}$ therefore cannot find a leakage current path through the parasitic PSUB/NWELL diode to the lower 3.3 v potential power rail VCC. Nor is it able to turn on pullup output transistor PMOS1 for a direct current path to VCCA. Thus the P channel transistor pullup output circuit arrangement of the output buffer circuit of FIG. 1 is operative both during power down or hot insertion and in the context of multiple incompatible power supplies to isolate the high potential power rail VCC, VCCA from the output $V_{OUT}$. Disruptive loading of the external bus 25, bus contention, degradation of signals or false signals on the common bus 25, and disruption by incompatible power supplies are prevented.

Figure 2:
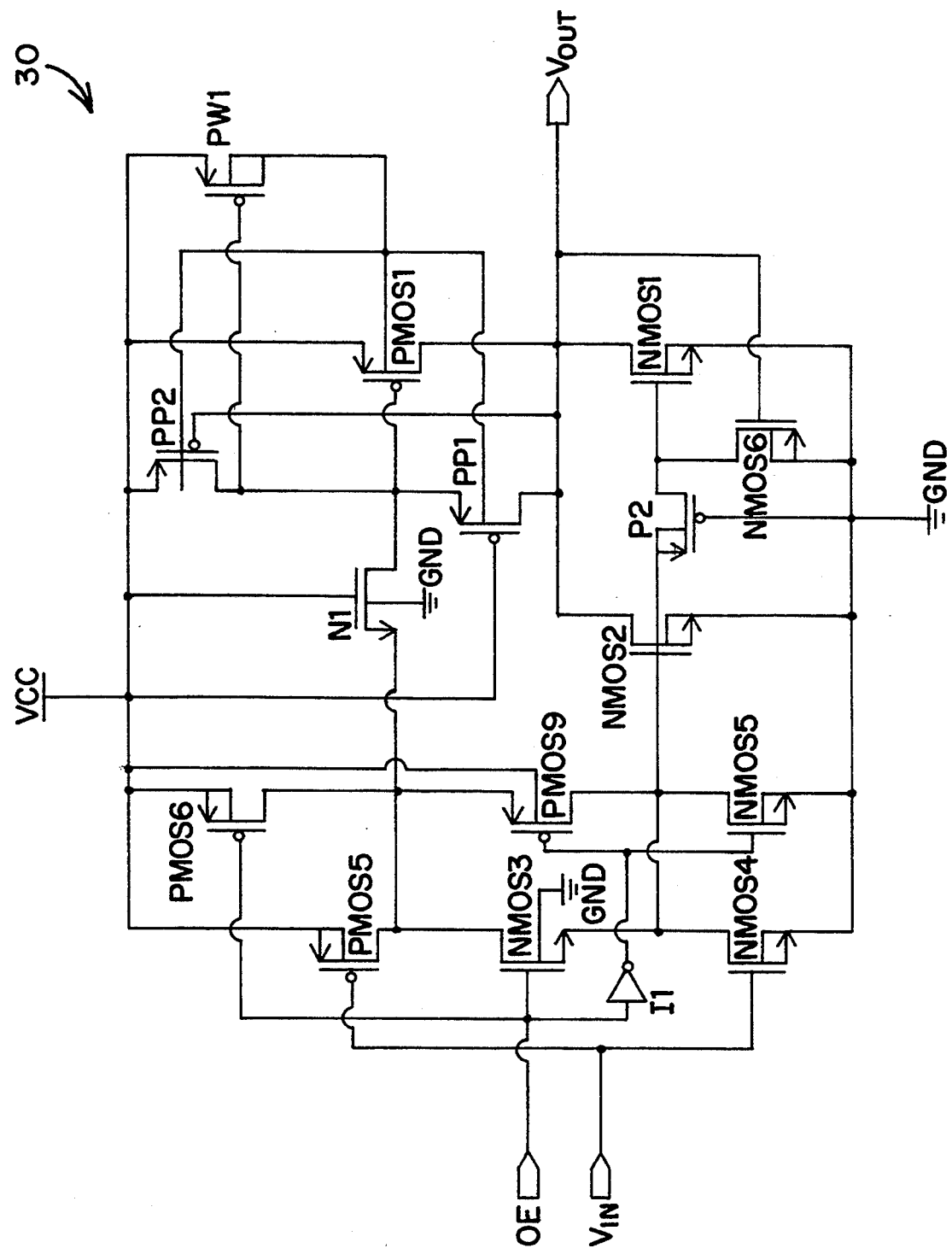
FIG. 2 is a schematic circuit diagram of another output buffer circuit according to the invention incorporating new components PW1, PP1, N1, PP2, and NMOS6.

The full swing output buffer circuit 30 illustrated in FIG. 2 provides improved turn off of the pullup and pulldown output transistors PMOS1, NMOS1 during normal bistate mode operation of the buffer circuit. Most of the components of output buffer circuit 30 are the same as the components of output buffer circuit 20 and are indicated by the same reference designations. In addition a P channel pull-to-the-rail transistor PP2 is coupled with primary current path between the control gate node of pullup output transistor PMOS1 and the high potential power rail VCC. The control gate node of PMOS pull-to-the-rail transistor PP2 is coupled to the output $V_{OUT}$.

Similarly an N channel pull-to-the-rail transistor NMOS6 is coupled between the control gate node of pulldown output transistor NMOS1 and the low potential power rail GND. The control gate node of NMOS pull-to-the-rail transistor NMOS6 is coupled to the output $V_{OUT}$. Upon transition from logic low to high potential level at the output $V_{OUT}$, pull-to-the-rail transistor NMOS6 fully shuts off pulldown output transistor NMOS1. Similarly upon transition from high to low potential level at the output $V_{OUT}$ pull-to-the-rail transistor PP2 fully turns off the pullup output transistor PMOS1. As shown in FIG. 2 the turn off facilitating Schottky diodes SD1 and SD2 can therefore be eliminated. PMOS pull-to-the-rail transistor PP2 may also be fabricated in the same output NWELL with PW1, PMOS1, and PP1.

A further variation is shown in the fragmentary portion of output buffer circuit 40 illustrated in FIG. 3. In the output buffer circuit 40 a PMOS pull-to-the-rail transistor PP2 is not used and the turn off facilitating Schottky diodes SD1 and SD2 are restored to the buffer circuit. In addition the N channel pull-to-the-rail transistor NMOS 6 is retained but in the position shown in FIG. 3 between the Schottky diode SD1 and ground potential power rail GND. The control gate node of discharge transistor NMOS6 is similarly coupled to the output $V_{OUT}$. In this position the N channel pull-to-the-rail transistor NMOS6 discharges the gate of primary pulldown output transistor NMOS1 when the output $V_{OUT}$ is above a PN junction threshold $V_{TH}$. Discharge transistor NMOS6 improves the performance of the output buffer circuit 40 when AC transients appear at the output $V_{OUT}$ and the high potential level power rail VCC is floating during power down.

During power down of the output buffer circuit while the high potential power rail VCC is floating, AC transients on the common external bus may still cause charge buildup on the internal VCC power rail through parasitic capacitance AC coupling of the output $V_{OUT}$ to the VCC power rail and internal nodes of the powered down buffer circuit. For example, the drain/source parasitic capacitance of pullup output transistor PMOS1 provides unwanted AC coupling between the output $V_{OUT}$ and the VCC power rail. To solve this problem for power down output buffer circuits, the present invention provides a new delay discharge circuit DDC as shown in the output buffer circuit 50 of FIG. 4. The output buffer circuit 50 is similar to output buffer circuits 20 and 40 and the same components or components performing similar functions are designated by the same reference numerals. Because of the addition of the delay discharge circuit DDC, the output buffer circuit 50 of FIG. 4 is applicable only for power down requirements and is not applicable for mixed power supply systems such as mixed 3.3 v standard and 5 v standard multiple output buffer circuit systems.

Figure 4:
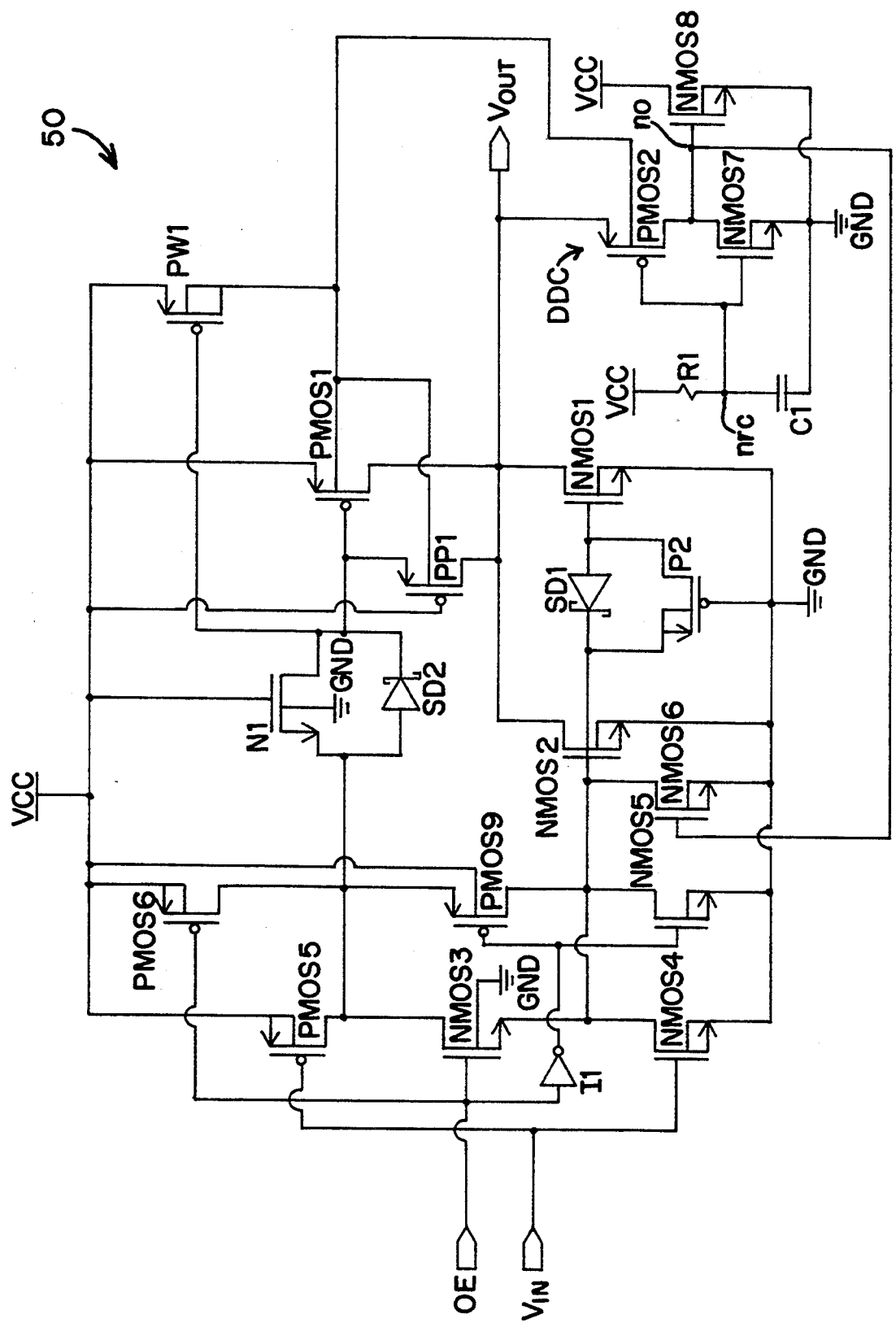
FIG. 4 is a schematic circuit diagram of another output buffer circuit according to the invention incorporating the new delay discharge circuit DDC in addition to circuit features PW1, PP1, N1, SD2, and NMOS6.

As shown in FIG. 4 the delay discharge circuit DDC includes components coupled between the output $V_{OUT}$ and low potential power rail GND and between the high potential power rail VCC and low potential power rail GND. An RC delay network is coupled between the high potential power rail VCC and low potential power rail GND with an intermediate node nrc. The RC delay network is provided by a resistor R1 coupled to the high potential power rail VCC and a capacitor C1 coupled to the low potential power rail GND. The resistor R1 and capacitor C1 are coupled together at the intermediate node nrc. The resistance and capacitance values are selected to delay turn off of the driver stage PMOS2, NMOS7 upon occurrence of a high potential level signal on the external bus and output $V_{OUT}$ during power down of the buffer circuit 50.

The driver stage PMOS2, NMOS7 is an inverter stage with a PMOS transistor PMOS2 having a primary current path coupled between the output $V_{OUT}$ and an output node no and an NMOS transistor NMOS7 with primary current path coupled between the output node no and low potential power rail GND. The input control node for the driver stage PMOS2, NMOS7 is coupled to the intermediate node nrc of the RC delay network. The driver stage is constructed to deliver current to the output node no after the delay introduced by the RC delay network in response to a transient high potential level signal on the external bus and at the output $V_{OUT}$ during power down of the buffer circuit while the high potential power rail VCC is floating.

A VCC power rail discharge transistor NMOS8 is coupled with the primary current path between the high potential power rail VCC and low potential power rail GND. The control node of the VCC discharge transistor NMOS8 is coupled to the output node no of the DDC driver stage for discharging transient current from the floating high potential power rail VCC upon occurrence of transient high potential level signals on the external bus and output $V_{OUT}$.

The delay discharge circuit DDC may also incorporate the pulldown or discharge NMOS pull-to-the-rail transistor NMOS6. Discharge transistor NMOS6 is coupled with the primary current path between the control node of pulldown output transistor NMOS1 through Schottky diode SD1 and the low potential power rail GND. The control gate node of NMOS6 is coupled to the output node no of the DDC inverter stage PMOS2, NMOS7 for discharging transient charge from the control node of the pulldown output transistor NMOS1 in phase with the VCC power rail discharge transistor NMOS8 during power down of buffer circuit 50.

In the preferred example embodiment the DDC driver stage PMOS pullup transistor PMOS2 is constructed in the same NWELL as the pullup output transistor PMOS1. Thus all of the P channel transistors associated with the output side of the output buffer circuits are fabricated in the same NWELL which is in turn driven by the NWELL switch transistor PW1.

Figure 5:
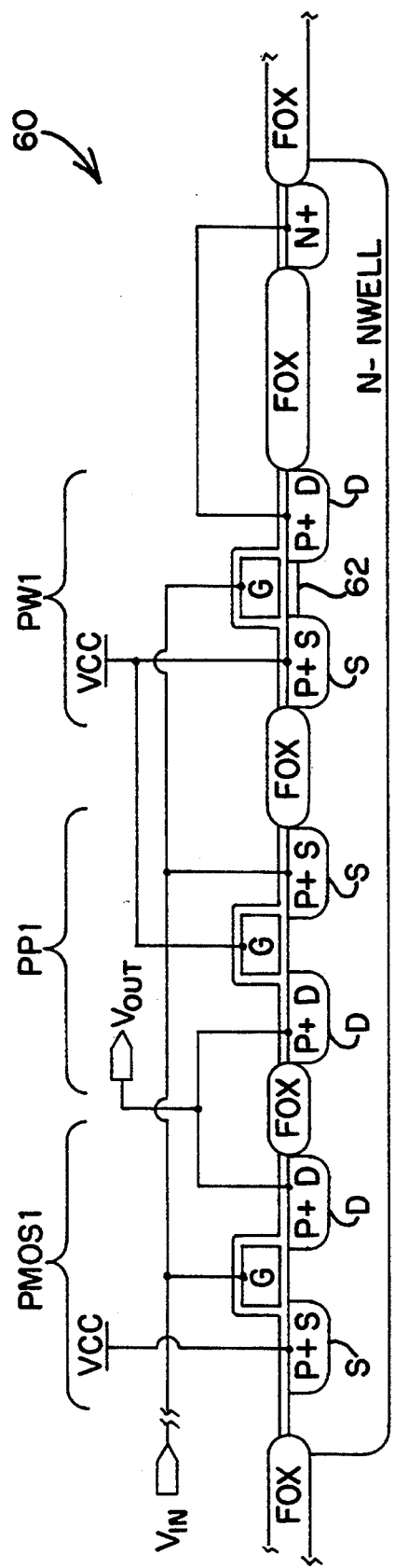
FIG. 5 is a simplified fragmentary side view of an integrated circuit for the buffer circuit of FIG. 1 showing the common NWELL fabrication for P channel transistors PW1, PP1, and PMOS1.
Figure 6:
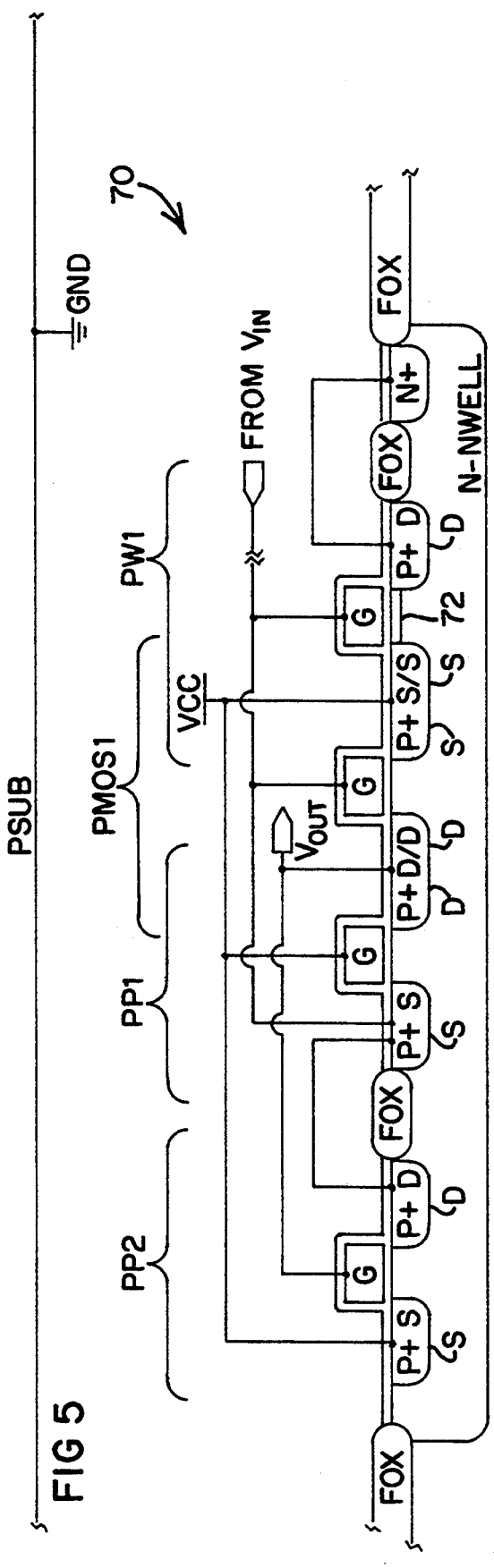
FIG. 6 is a simplified fragmentary side view of an integrated circuit for the output buffer circuit of FIG. 2 showing the common NWELL fabrication for P channel transistors PW1, PMOS1, PP1, and PP2.

Example integrated circuit structures 60, 70 showing fabrication of the respective PMOS or P channel transistors on the output side of the output buffer circuits are illustrated in FIGS. 5 and 6. In FIGS. 5 and 6 the P+ source and drain regions of the respective output PMOS transistors are indicated by the reference designations S and D. The respective control gate regions coupling the P+ source regions S and drain regions D for the respective transistors are designated G while isolation between transistors is shown by field oxide FOX. All of the output P channel transistors are fabricated in a common N− semiconductor material NWELL in turn formed in a P type semiconductor material substrate PSUB.

A typical construction 60 for the P channel output transistors for output buffer circuit 20 of FIG. 1 is shown in FIG. 5. NWELL switch transistor PW1 couples the NWELL or backgate to the high potential power rail VCC. Typical fabrication 70 of the P channel output transistors for output buffer circuit 30 of FIG. 2 is illustrated in FIG. 6. In this example the P+ semiconductor material source and drain regions which function as source and drain regions in more than one transistor are designated S/S and D/D. Additionally, P channel pull-to-the-rail transistor PP2 is also incorporated in the N− semiconductor material NWELL.

While the invention has been described with reference to particular example embodiments it is intended to cover all modifications and equivalents within the scope of the following claims.

We claim:

1. A buffer circuit having an output for delivering output signals of high and low potential levels and a selected output transistor having a primary current path coupled between the output and a selected power rail of opposite high and low potential power rails, said selected output transistor having a control node coupled in the buffer circuit for controlling the conducting state of the selected output transistor primary current path, said selected output transistor being fabricated in a well of first type carrier semiconductor material formed in a substrate of second type carrier semiconductor material, said well being coupled to the selected power rail and the substrate being coupled to the opposite power rail, the improvement comprising:

a well isolation switch transistor having a primary current path coupled between the well of the output transistor and the selected power rail, said well isolation switch transistor having a control node coupled to the control node of the selected output transistor for controlling the conducting state of the well isolation switch transistor substantially in phase with the selected output transistor thereby isolating the output transistor well from the selected power rail when the output transistor is not conducting, said selected output transistor being a PMOS transistor, said well being an NWELL, and said well isolation switch transistor being a PMOS transistor.

2. The buffer circuit of claim 1 wherein the buffer circuit comprises pullup and pulldown output transistors coupled to the output having control nodes coupled in the buffer circuit, an input for receiving data input signals, and a predriver circuit coupled between the input and control nodes of the output transistors for driving the pullup and pulldown output transistors and further comprising:

a control node isolation transistor coupled between the control node of the selected output transistor and the predriver circuit of the buffer circuit, said control node isolation transistor having a control node coupled to the selected power rail for turning off the control node isolation transistor and isolating the control nodes of the output transistors during power down of the selected power rail or during occurrence of incompatible power supply voltage levels.

3. The buffer circuit of claim 2 wherein the selected output transistor is the pullup output transistor, the control node isolation transistor is an N channel transistor, and the control gate node of the N channel control node isolation transistor is coupled to the high potential power rail.

4. The buffer circuit of claim 2 comprising a feedback turn off transistor having a primary current path coupled between the output and control node of the selected output transistor said feedback turn off transistor having a control node coupled to the selected power rail for turning off the selected output transistor in response to a higher potential level signal at the output.

5. The buffer circuit of claim 4 comprising a pull-to-the-rail transistor for normal mode operation of the buffer circuit having a primary current path coupled between the control node of the pullup output transistor and selected power rail, said pull-to-the-rail transistor having a control node coupled to the output to cause pullup of the control node of the selected output transistor to the selected power rail potential level during occurrence of a low potential level signal at the output.

6. The buffer circuit of claim 1 wherein the selected output pullup transistor and well isolation switch transistor are fabricated in the same well.

7. The buffer circuit of claim 4 wherein the selected output pullup transistor, well isolation switch transistor and feedback turn off transistor are fabricated in the same well.

8. The buffer circuit of claim 5 wherein the selected output transistor, well isolation switch transistor, feedback turn off transistor, and pull-to-the-rail transistor are fabricated in the same well.

9. The buffer circuit of claim 1 wherein the selected output transistor is a PMOS pullup output transistor fabricated in a well of N type carrier semiconductor material formed in a substrate of P type carrier semiconductor material, said well being coupled to the high potential power rail and said substrate being coupled to the low potential power rail, and wherein the well isolation switch transistor is a P channel PMOS transistor fabricated in the same well as the pullup output transistor and forming a well isolation switch between the well and the high potential power rail, said P channel well isolation switch transistor operating in phase with the PMOS output pullup transistor.

10. The buffer circuit of claim 2 comprising a plurality of buffer circuits, each as set forth in claim 2 and constructed in separate wells of N type carrier semiconductor material, at least two of said wells being coupled to different power supplies supplying different power supply potential levels.

11. A buffer circuit having an output for delivering output signals of high and low potential levels and a P channel pullup output transistor having a primary current path coupled between the output and a high potential power rail, said pullup output transistor having a control gate node coupled in the buffer circuit for controlling the conducting state of the pullup output transistor primary current path, said pullup output transistor being fabricated in a well of N type carrier semiconductor material formed in a substrate of P type carrier semiconductor material, said well being coupled to the high potential power rail and the substrate being coupled to a low potential power rail, the improvement comprising:

a P channel NWELL isolation switch transistor having a primary current path coupled between the well of the pullup output transistor and high potential power rail, said NWELL isolation switch transistor having a control gate node coupled in the buffer circuit to the control gate node of the pullup output transistor for controlling the conducting state of the NWELL isolation switch transistor substantially in phase with the pullup output transistor thereby isolating the pullup output transistor well from the high potential power rail when the pullup output transistor is not conducting.

12. The buffer circuit of claim 11 wherein the buffer circuit comprises pullup and pulldown output transistors coupled to the output having control gate nodes coupled in the buffer circuit, an input for receiving data input signals, and a predriver circuit coupled between the input and control gate nodes of the output transistors for driving the pullup and pulldown output transistors and further comprising:

an N channel control node isolation transistor having a primary current path coupled between the control gate node of the pullup output transistor and the predriver circuit of the buffer circuit, said control node isolation transistor having a control gate node coupled to the high potential power rail for turning off the control node isolation transistor and isolating the control gate nodes of the output transistors from each other during power down of the selected power rail or during occurrence of incompatible power supply voltage levels.

13. The buffer circuit of claim 12 comprising a P channel feedback turn off transistor having a primary current path coupled between the output and control gate node of the pullup output transistor, said feedback turn off transistor having a control gate node coupled to the high potential power rail for turning off the pullup output transistor in response to high potential level signals at the output during power down of the buffer circuit.

14. The buffer circuit of claim 13 comprising a P channel pull-to-the-rail transistor for normal mode operation of the buffer circuit having a primary current path coupled between the control gate node of the pullup output transistor and high potential power rail, said pull-to-the-rail transistor having a control gate node coupled to the output for pullup of the control gate node of the pullup output transistor to the high potential power rail potential level in response to a low potential level signal at the output.

15. The buffer circuit of claim 11 wherein the P channel pullup output transistor and P channel isolation switch transistor are fabricated in the same well of N type carrier semiconductor material.

16. The buffer circuit of claim 13 wherein the P channel pullup output transistor, P channel NWELL isolation switch transistor and P channel feedback turn off transistor are fabricated in the same well of N type carrier semiconductor material.

17. The buffer circuit of claim 14 wherein the P channel pullup output transistor, P channel NWELL isolation switch transistor, P channel feedback turn off transistor, and P channel pull-to-the-rail transistor are fabricated in the same well of N type carrier semiconductor material.

18. The buffer circuit of claim 14 wherein the pulldown output transistor is an N channel output transistor and comprising an N channel pull-to-the-rail transistor having a primary current path coupled between the control gate node of the N channel pulldown output transistor and low potential power rail and a control gate node coupled to the output to pulldown the control gate node of the pulldown output transistor to the low potential power rail potential level in response to a high potential level signal at the output.

19. The buffer circuit of claim 11 wherein:
the output is coupled to a bus for delivering output signals of logic high and low potential levels, and a pulldown output transistor is coupled between the output and a low potential power rail, the improvement for discharging transient charge from the high potential power rail to the low potential power rail during power down of the buffer circuit, comprising:
a delay discharge circuit (DDC) coupled between the output and low potential power rail and between the high potential power rail and low potential power rail;
said DDC comprising an RC delay network coupled between the high potential power rail and low potential power rail with an intermediate node;
said DDC comprising a driver stage having primary current paths coupled between the output and an output node and between the output node and low potential power rail, an input control node coupled to the intermediate node of the RC delay network, said driver stage being constructed to deliver current to said output node in response to a transient high potential level signal at the bus and output during power down of the buffer circuit;
and a VCC discharge transistor having primary current path coupled between the high potential power rail and low potential power rail and a control node coupled to the output node of the driver stage for discharging transient charge from the high potential power rail upon occurrence of high potential level signals on the bus and output during power down of the buffer circuit.

20. The buffer circuit of claim 19 wherein the driver stage comprises an invertor stage having a PMOS pullup transistor constructed in the same well as the output pullup transistor.

21. The buffer circuit of claim 20 comprising a pulldown NMOS pull-to-the-rail transistor having a primary current path coupled between the control node of the output pulldown transistor and low potential power rail, said NMOS pull-to-the-rail transistor having a control gate node coupled to the output node of the DDC invertor stage for discharging transient charge from the control node of the pulldown output transistor in phase with the VCC discharge transistor during power down of the buffer circuit.

22. The buffer circuit of claim 13 comprising a plurality of buffer circuits, each as set forth in claim 13 and constructed in separate wells of N type carrier semiconductor material, at least two of said wells being coupled to different power supplies supplying different power supply potential levels.

23. A buffer circuit having an output coupled to a bus for delivering output signals of logic high and low potential levels, a pullup output transistor having primary current path coupled between a high potential power rail and output, and a pulldown output transistor coupled between the output and a low potential power rail, the improvement for discharging transient charge from the high potential power rail to the low potential power rail during power down of the buffer circuit, comprising:
a delay discharge circuit (DDC) coupled between the output and low potential power rail and between the high potential power rail and low potential power rail;
said DDC comprising an RC delay network coupled between the high potential power rail and low potential power rail with an intermediate node;
said DDC comprising a driver stage having primary current paths coupled between the output and an output node and between the output node and low potential power rail, an input control node coupled to the intermediate node of the RC delay network, said driver stage being constructed to deliver current to said output node in response to a transient high potential level signal at the bus and output during power down of the buffer circuit;
and a VCC discharge transistor having primary current path coupled between the high potential power rail and low potential power rail and a control node coupled to the output node of the DDC driver stage for discharging transient charge from the high potential power rail upon occurrence of high potential level signals on the bus and output during power down of the buffer circuit.

24. The buffer circuit of claim 23 wherein the output pullup transistor is a PMOS transistor formed in a well of N type carrier semiconductor material, in turn formed in a substrate of P type carrier semiconductor material, said well being coupled to the high potential power rail and said substrate being coupled to the low potential power rail.

25. The buffer circuit of claim 24 wherein the driver stage comprises a PMOS pullup transistor constructed in the same well as the output pullup transistor.

26. The buffer circuit of claim 25 wherein the VCC discharge transistor comprises an NMOS transistor, and further comprising a pulldown NMOS pull-to-the-rail transistor having a primary current path coupled between the control node of the output pulldown transistor and low potential power rail, said NMOS pull-to-the-rail transistor having a control gate node coupled to the output node of the DDC invertor stage for discharging transient charge from the control node of the pulldown output transistor in phase with the VCC discharge transistor during power down of the buffer circuit.

27. The buffer circuit of claim 23 wherein the RC delay network comprises a resistor coupled to the high potential power rail, a capacitor coupled to the low potential power rail and an intermediate node between the resistor and capacitor, the resistance and capacitance values being selected to delay turn off of the driver stage upon occurrence of a high potential signal on the bus and output during power down of the buffer circuit.

* * * * *